United States Patent
Inbar et al.

(10) Patent No.: US 12,266,670 B2
(45) Date of Patent: Apr. 1, 2025

(54) METHOD FOR MANUFACTURING AN OPTICAL UNIT THAT COMPRISES AN ARRAY OF ORGANIC MICROLENSES

(71) Applicant: Tower Semiconductor Ltd., Migdal Haemek (IL)

(72) Inventors: Naor Inbar, Migdal Haemek (IL); Omer Katz, Migdal Haemek (IL); Tzur Miller, Migdal Haemek (IL); Ayala Elkayam, Migdal Haemek (IL)

(73) Assignee: Tower Semiconductor Ltd., Migdal Hemek (IL)

(*) Notice: Subject to any disclaimer, the term of this patent is extended or adjusted under 35 U.S.C. 154(b) by 623 days.

(21) Appl. No.: 17/652,081

(22) Filed: Feb. 22, 2022

(65) Prior Publication Data

US 2023/0268363 A1 Aug. 24, 2023

(51) Int. Cl.
| | |
|---|---|
| H01L 27/146 | (2006.01) |
| H01L 23/00 | (2006.01) |
| H01L 23/31 | (2006.01) |
| H10K 10/88 | (2023.01) |
| H10K 39/32 | (2023.01) |
| H10K 50/844 | (2023.01) |
| H10K 59/80 | (2023.01) |

(52) U.S. Cl.
CPC .... *H01L 27/14627* (2013.01); *H01L 23/3171* (2013.01); *H01L 24/06* (2013.01); *H01L 27/14685* (2013.01); *H10K 10/88* (2023.02); *H10K 39/32* (2023.02); *H10K 50/844* (2023.02); *H10K 59/873* (2023.02); *H01L 2224/03831* (2013.01)

(58) Field of Classification Search
CPC ...... H10K 39/32; H10K 10/88; H10K 50/844; H10K 59/873; H01L 21/14627; H01L 21/14685; H01L 21/14643; H01L 21/14621; H01L 24/02; H01L 24/06; H01L 25/0753; H01L 23/3171; H01L 2224/03831
See application file for complete search history.

(56) References Cited

U.S. PATENT DOCUMENTS

| | | | |
|---|---|---|---|
| 9,793,309 B2* | 10/2017 | Seo | H01L 27/14636 |
| 2008/0265348 A1* | 10/2008 | Maas | H01L 31/02162 |
| | | | 257/E31.127 |
| 2008/0303107 A1* | 12/2008 | Minamio | H01L 27/14618 |
| | | | 257/E31.127 |
| 2009/0008729 A1* | 1/2009 | Yang | H01L 27/14618 |
| | | | 257/E31.127 |
| 2015/0001576 A1* | 1/2015 | Iwata | H10K 50/865 |
| | | | 438/26 |

* cited by examiner

*Primary Examiner* — Alonzo Chambliss
(74) *Attorney, Agent, or Firm* — Reches Patents

(57) ABSTRACT

A method for manufacturing optical unit, the method includes (a) obtaining an intermediate optical unit that comprises a semiconductor portion, a transparent organic layer, the array of organic microlenses and a protective layer; (b) depositing a protective mask above a first protective layer region; (c) removing, by applying a first etch process, the second protective layer region to expose a second region of the transparent organic layer; and (d) removing, by applying a second etch process, the second region of the transparent organic layer to expose the contact pads and removing the protective mask while maintaining the first protective layer portion.

19 Claims, 5 Drawing Sheets

15

16

17

Focusing radiation by an array of organic microlenses onto an image sensor pixel array. The array of organic microlenses and the image sensor pixel array belong to an optical unit manufactured according to method 100. 210

Sensing the radiation by the image sensor pixel array. 220

200

METHOD FOR MANUFACTURING AN OPTICAL UNIT THAT COMPRISES AN ARRAY OF ORGANIC MICROLENSES

BACKGROUND OF THE INVENTION

An optical unit may include a semiconductor portion that includes a substrate, contact pads and an image sensor pixel array. The semiconductor portion may support a thick transparent organic layer that in turn supports an array of organic microlenses.

The thickness of the transparent organic layer may vary according to the required distance between the image sensor pixel array and the array of organic microlenses—the distance is dictated by the focal length of the array of organic microlenses.

There is a growing need to protect the array of organic microlenses in an efficient manner.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
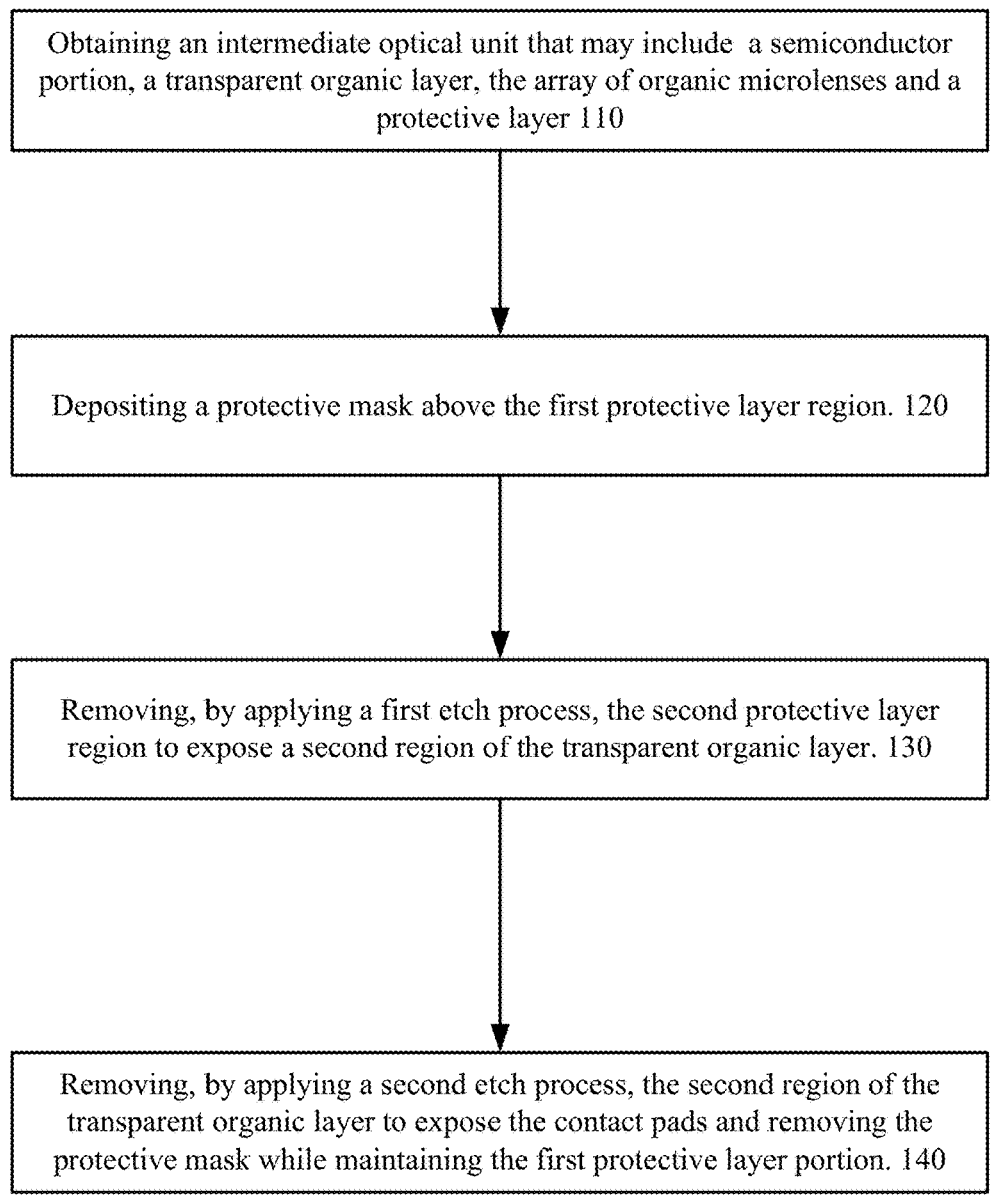
FIG. 1 is an example of a method.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference to contact pads should be applied mutatis mutandis to scribe lines.

FIG. 1 illustrates method 100 for manufacturing an optical unit that may include an array of organic microlenses.

Method 100 may start by step 110 of obtaining an intermediate optical unit that may include a semiconductor portion, a transparent organic layer, the array of organic microlenses and a protective layer.

The semiconductor portion may include one or more semiconductor elements but may also include other elements such as conductors (for example one or more metal layers), and the like.

The semiconductor portion may include a substrate, contact pads and an image sensor pixel array.

The protective layer may include a first protective layer region and a second protective layer region.

The first protective layer portion may be deposited on the array of organic microlenses.

The second protective layer portion may be deposited on a part of an upper layer of the transparent organic layer.

Step 110 may include receiving the intermediate optical unit or manufacturing the intermediate optical unit. Step 110 may include manufacturing at least some of the parts of the intermediate optical unit.

Step 110 may include depositing the protective layer on the array of organic microlenses.

Step 110 is executed before the exposing of the contact pads. In this case the array of the organic microlenses is positioned on a flat plane and thus is easy to coat by spreading coating material.

It should be noted that method 100 may be applied on multiple intermediate optical units and step 110 may be applied on multiple spaced apart arrays of organic microlenses. The arrays may be located at the same plane and without tunnels between them—and their coating can be highly effective.

On the other hand—when attempting to coat the array area when the bonding pads and scribe lines are open (and may form relatively deep tunnels for receiving the coating material)—then the micro lenses coating material may not reach the necessary coating uniformity.

The protective layer may act as a hard mask during a second etch process.

The protective layer may provide mechanical protection to the array of organic microlenses during various steps of manufacture—for example dicing of a wafer, polishing of the wafer, and the like. act as a hard mask during a second etch process.

The protective layer may be less sticky than the array of organic microlenses and thus may aggregate less dust or particles.

The protective layer can be an oxide layer or a nitride layer (for example SiN layer).

The protective layer may be thinner (and even much thinner) than the transparent organic layer. For example may have a thickness that does not exceed a micron and may be even much thinner—for example one hundred nanometers—or between 50-250 nanometers, and the like.

The depth of the transparent organic layer may range between 1-30, or 5-15 microns. The same process and the even the same depth of protective mask may "cover" a large range of transparent organic layer depths.

The protective layer may be an antireflective layer.

The transparent organic layer may include one or more filtering elements.

Step 110 may be followed by step 120 of depositing a protective mask above the first protective layer region.

Step 120 may be followed by step 130 of removing, by applying a first etch process, the second protective layer region to expose a second region of the transparent organic layer.

The etch rate of the protective mask in relation to the first etch process may be lower than an etch rate of the second protective layer region in relation to the first etch process.

The protective mask may withstand the first etch process in the sense that it will not be completely etched or otherwise expose the first protective layer due to the first etch process.

Step 130 may be followed by step 140 of removing, by applying a second etch process, the second region of the transparent organic layer to expose the bonding pads and removing the protective mask while maintaining the first protective layer portion.

The protective layer may be an oxide, the protective mask may be a resist, and the transparent organic layer may be a resist.

The first etch process may be an oxide etch process and wherein the second etch process may be a resist etch process.

The first etch process may differ from the second etch process by a relationship between $O_2$ concentration and $CF_4$ concentration. For example—during the first etch process the concentration of the $CF_4$ well exceeds the concentration of the $O_2$. Yet for another example—during the second etch process the concentration of the $CF_4$ is well below the concentration of the $O_2$.

Figure 2:
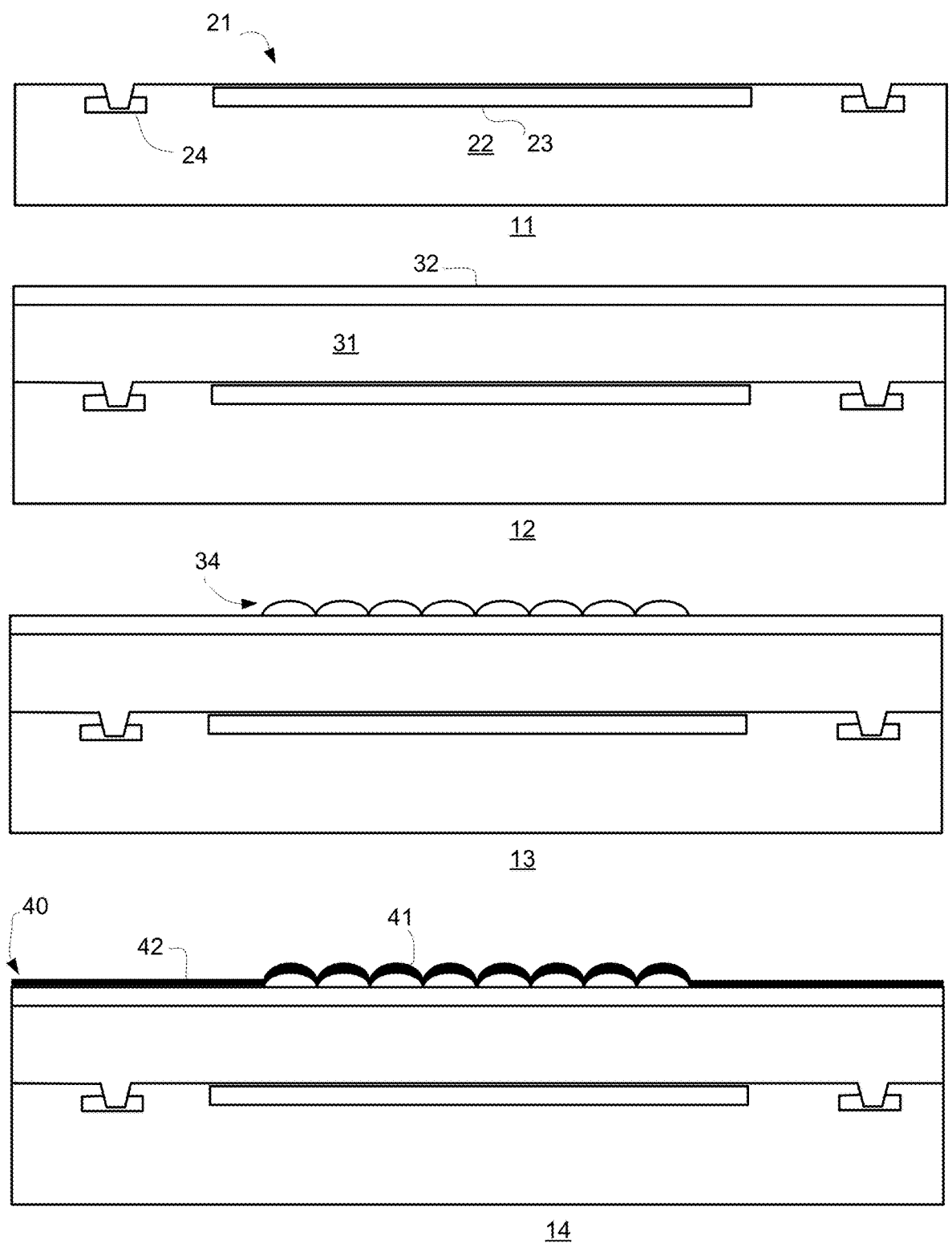
FIG. 2 is an example of one of more intermediate optical units manufactured by one or more steps of the method for FIG. 1.
Figure 3:
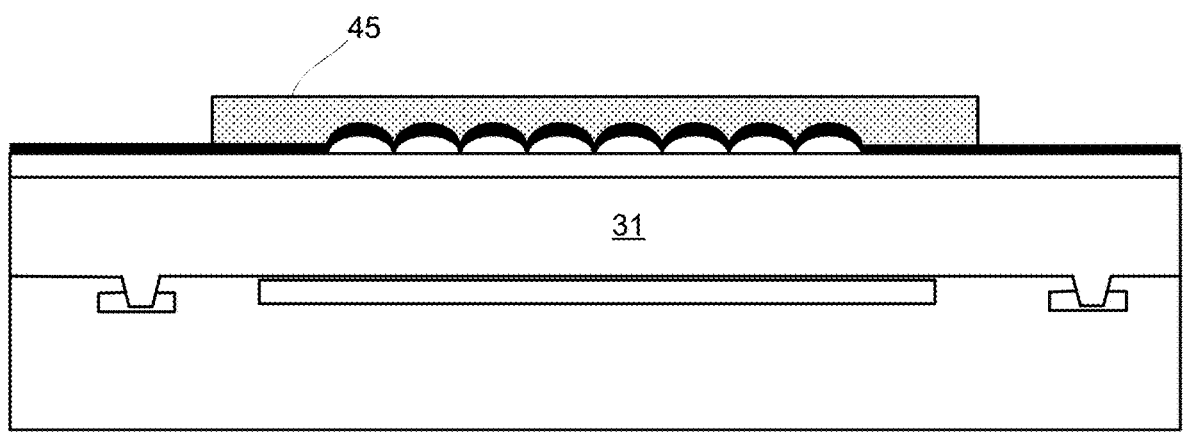
FIG. 3 is an example of one of more intermediate optical units manufactured by one or more steps of the method for FIG. 1.
Figure 3:
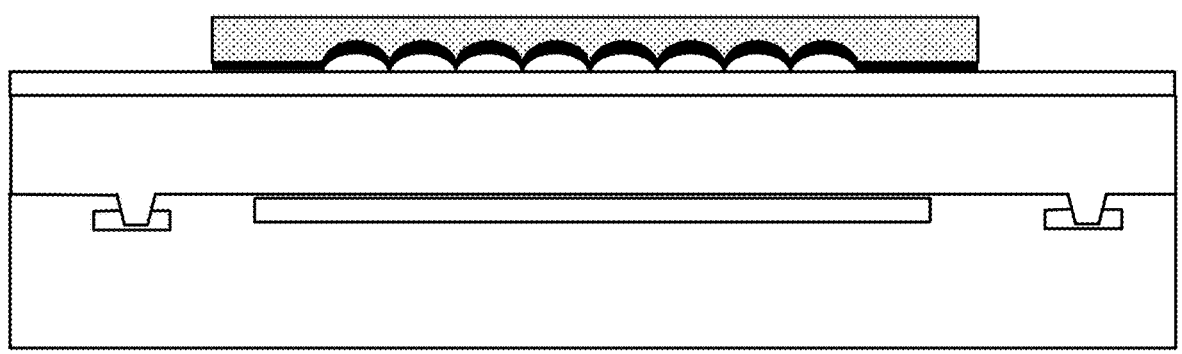
Figure 3:
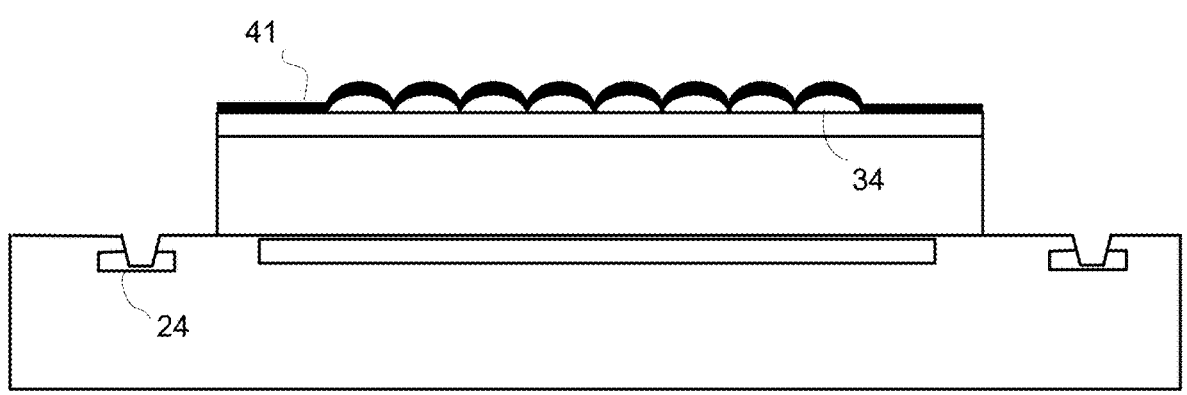
Figure 4:
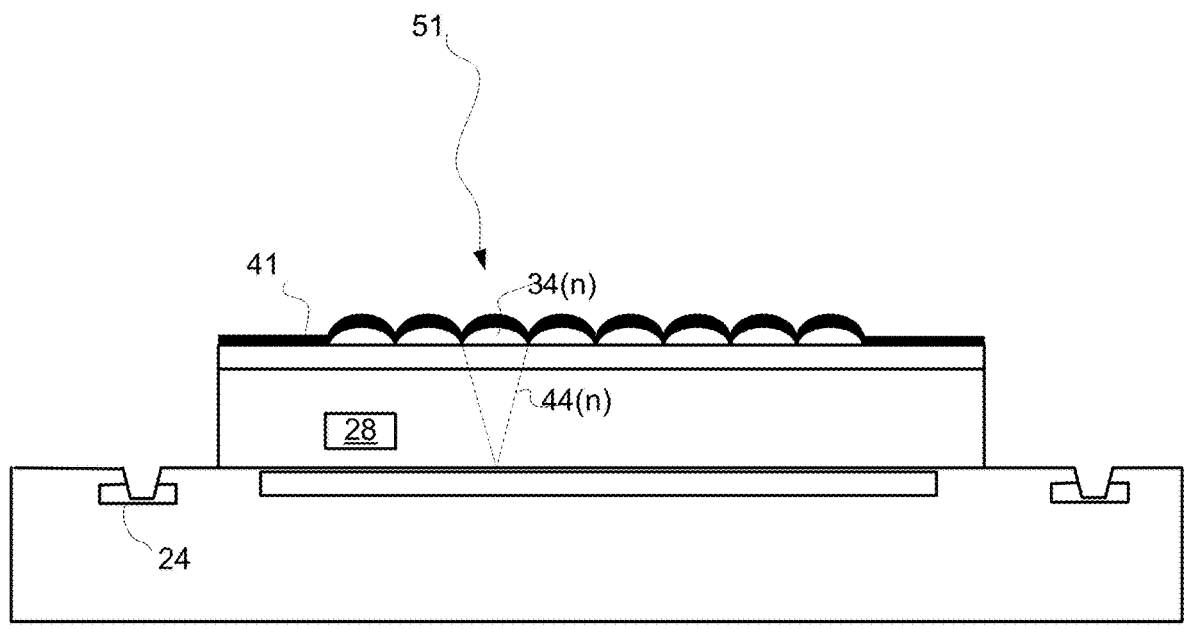
FIG. 4 is an example of one of more steps of the method for FIG. 1.

FIGS. 2, 3 and 4 illustrate various example of the execution of method 100.

Referring to FIG. 2—first intermediate optical unit 11 includes a semiconductor portion that includes substrate 22, bonding pads 24 that are exposed, and an image sensor pixel array 21. Other circuits such as a readout circuit, power supply circuits, or any other circuit—for example a circuit that may provide signals or may receive signals from or to the bonding pads is not shown for simplicity of explanation.

Second intermediate optical unit 12 is manufactured by adding a transparent organic layer that is illustrates as including an upper layer 32 and a lower layer 31. The transparent organic layer may have a single layer or may include more than two layers.

Other optical components such as filtering elements within the transparent organic layer are not shown for simplicity of explanation.

Third intermediate optical unit 13 is manufactured by forming an array of organic microlenses 34 on top of the transparent organic layer.

Fourth intermediate optical unit 14 is manufactured by forming a protective layer 40 on top of the array of organic microlenses 34 and on top of the transparent organic layer.

The protective layer 40 has a first protective layer region 41 located on top of the array of organic microlenses 34 and a second protective layer region 42 that is formed on a top surface of the transparent organic layer—and to the sides of the array of organic microlenses 34.

In FIG. 3 the first protective layer 45 region 41 is located on the array of organic microlenses but also expanded to the sides of the array of organic microlenses 34.

Step 110 of method 100 may include receiving the fourth intermediate optical unit 14. Step 110 may include performing one or more steps to provide one or more of the first till fourth intermediate optical layers.

Referring to FIG. 3—the fifth intermediate optical unit 15 may be formed by step 120 of depositing a protective mask 45 above the first protective layer region. In FIG. 3 the first protective layer region expands to the side of the protective mask.

The sixth intermediate optical unit 16 may be formed by step 130 of removing, by applying a first etch process, the second protective layer region to expose a second region of the transparent organic layer. In FIG. 3 the protective mask expands to the sides of the array of microlens.

The seventh intermediate optical unit 17 may be formed by step 140 of removing, by applying a second etch process, the second region of the transparent organic layer to expose the bonding pads and removing the protective mask while maintaining the first protective layer portion.

FIG. 4 illustrates an example of an optical unit in which a filter 28 is located within the transparent organic layer. FIG. 4 also illustrates an organic microlens 34(n) that focuses (the focusing of the beam is illustrated by dashed lines 44(n)) radiation 51 onto a pixel of the image sensor pixel array.

Figure 5:
FIG. 5 is an example of a method.

FIG. 5 illustrates an example of a method 200 for sensing radiation.

Method 200 may start by step 210 of focusing radiation by an array of organic microlenses onto an image sensor pixel array; wherein the array of organic microlenses and the image sensor pixel array belong to an optical unit.

Step 210 may be followed by step 220 of sensing the radiation by the image sensor pixel array. Step 220 may be followed by generating detection signals and outputting the detection signals.

The optical unit is manufactured by method 100.

Any reference to any of the terms "comprise", "comprises", "comprising" "including", "may include" and "includes" may be applied mutatis mutandis to any of the terms "consists", "consisting", "consisting essentially of". For example—any of the rectifying circuits illustrated in any figure may include more components that those illustrated in the figure, only the components illustrated in the figure or substantially only the components illustrated in the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for manufacturing optical unit that comprises an array of organic microlenses, the method comprises:
    obtaining an intermediate optical unit that comprises a semiconductor portion, a transparent organic layer, the array of organic microlenses and a protective layer; wherein the semiconductor portion comprises a substrate, bonding pads and an image sensor pixel array; wherein the protective layer comprises a first protective layer region and a second protective layer region;
    wherein the first protective layer portion is deposited on the array of organic microlenses;
    wherein the second protective layer portion is deposited on a part of an upper layer of the transparent organic layer;
    applying a protective mask above the first protective layer region;
    removing, by applying a first etch process, the second protective layer region to expose a second region of the transparent organic layer; and
    removing, by applying a second etch process, the second region of the transparent organic layer to expose the bonding pads and removing the protective mask while maintaining the first protective layer portion.

2. The method according to claim 1, wherein an etch rate of the protective mask in relation to the first etch process is lower than an etch rate of the second protective layer region in relation to the first etch process.

3. The method according to claim 1, wherein the obtaining of the intermediate optical unit comprises depositing the protective layer on the array of organic microlenses.

4. The method according to claim 1, wherein the protective layer is an oxide, the protective mask is a resist, and the transparent organic layer is a resist.

5. The method according to claim 1, wherein the first etch process is an oxide etch process and wherein the second etch process is a resist etch process.

6. The method according to claim 1, wherein the first etch process differs from the second etch process differ from each other by a relationship between $O_2$ concentration and $CF_4$ concentration.

7. The method according to claim 1, wherein a depth of the transparent organic layer ranges between five and fifty microns.

8. The method according to claim 1, wherein the protective layer is a antireflective layer.

9. The method according to claim 1, wherein the transparent organic layer comprising one or more filtering elements.

10. A method for sensing radiation, the method comprises:
    focusing radiation by an array of organic microlenses onto an image sensor pixel array; wherein the array of organic microlenses and the image sensor pixel array belong to an optical unit; and
    sensing the radiation by the image sensor pixel array;
    wherein the optical unit is manufactured by a process that comprises:
    obtaining an intermediate optical unit that comprises a semiconductor portion, a transparent organic layer, the array of organic microlenses and a protective layer; wherein the semiconductor portion comprises a substrate, contact pads and an image sensor pixel array; wherein the protective layer comprises a first protective layer region and a second protective layer region; wherein the first protective layer portion is deposited on the array of organic microlenses; wherein the second protective layer portion is deposited on a part of an upper layer of the transparent organic layer;
    depositing a protective mask above the first protective layer region;
    removing, by applying a first etch process, the second protective layer region to expose a second region of the transparent organic layer; and
    removing, by applying a second etch process, the second region of the transparent organic layer to expose the bonding pads and removing the protective mask while maintaining the first protective layer portion.

11. An optical unit that comprises an array of organic microlenses, a semiconductor portion, a transparent organic layer; and a protective layer;
   wherein the optical unit is manufactured by a process that comprises:
   obtaining an intermediate optical unit that comprises the semiconductor portion, the transparent organic layer, the array of organic microlenses and the protective layer; wherein the semiconductor portion comprises a substrate, bonding pads and an image sensor pixel array; wherein the protective layer comprises a first protective layer region and a second protective layer region; wherein the first protective layer portion is deposited on the array of organic microlenses; wherein the second protective layer portion is deposited on a part of an upper layer of the transparent organic layer;
   depositing a protective mask above the first protective layer region;
   removing, by applying a first etch process, the second protective layer region to expose a second region of the transparent organic layer; and
   removing, by applying a second etch process, the second region of the transparent organic layer to expose the contact pads and removing the protective mask while maintaining the first protective layer portion.

12. The optical unit according to claim 11, wherein an etch rate of the protective mask in relation to the first etch process is lower than an etch rate of the second protective layer region in relation to the first etch process.

13. The optical unit according to claim 11, wherein the obtaining of the intermediate optical unit comprises depositing the protective layer on the array of organic microlenses.

14. The optical unit according to claim 11, wherein the protective layer is an oxide, the protective mask is a resist, and the transparent organic layer is a resist.

15. The optical unit according to claim 11, wherein the first etch process is an oxide etch process and wherein the second etch process is a resist etch process.

16. The optical unit according to claim 11, wherein the first etch process differs from the second etch process differ from each other by a relationship between $O_2$ concentration and $CF_4$ concentration.

17. The optical unit according to claim 11, wherein a depth of the transparent organic layer ranges between five and fifty microns.

18. The optical unit according to claim 11, wherein the protective layer is an antireflection layer.

19. The optical unit according to claim 11, wherein the transparent organic layer comprising one or more filtering elements.

* * * * *